United States Patent [19]

Fütterer

[11] Patent Number: 4,560,951
[45] Date of Patent: Dec. 24, 1985

[54] VOLTAGE-CONTROLLED OSCILLATOR WITH SURFACE-WAVE TRANSMISSION LINE

[75] Inventor: Augustin Fütterer, Eching, Fed. Rep. of Germany

[73] Assignee: Siemens Aktiengesellschaft, Berlin and Munich, Fed. Rep. of Germany

[21] Appl. No.: 576,297

[22] Filed: Feb. 2, 1984

[30] Foreign Application Priority Data

Feb. 17, 1983 [DE] Fed. Rep. of Germany ....... 3305453

[51] Int. Cl.⁴ ................................................ H03B 5/32
[52] U.S. Cl. ............................ 331/107 A; 331/108 B; 331/177 V
[58] Field of Search ........... 331/107 A, 108 B, 177 V, 331/155; 332/26; 333/150, 152, 193

[56] References Cited

U.S. PATENT DOCUMENTS 3,855,548 12/1974 Nandi et al. .................... 331/107 A
4,011,526 3/1977 Kinsman ......................... 331/107 A

OTHER PUBLICATIONS

"Oberflaechenwellen-Bauelemente", Veilleux, Bauelemente, Elektronik 14/1981, pp. 35 to 41.

Primary Examiner—Siegfried H. Grimm
Attorney, Agent, or Firm—Thomas H. Jackson

[57] ABSTRACT

A voltage-controlled oscillator includes an amplifier having two emitter-coupled differential amplifier stages, and in whose feedback network, connected in series, are a 3dB-90° coupler and a surface-wave transmission line. Two variable capacitance diodes are connected to the two terminals of the coupler that are not used as input or output terminals, and a frequency control voltage is applied to both diodes. The oscillator is particularly well-suited for the transmission of digital signals with transmission speeds of over 100 Mbit/s.

11 Claims, 2 Drawing Figures

VOLTAGE-CONTROLLED OSCILLATOR WITH SURFACE-WAVE TRANSMISSION LINE

BACKGROUND OF THE INVENTION

The invention relates to a voltage-controlled oscillator with an amplifier and a feedback network containing variable capacitance diodes.

Voltage-controlled oscillators of this type are frequently used in digital transmission technology in transmission lines and multiplex equipment with transmission speeds exceeding 100 Mbit/s. In regenerators and frequency converters used in line terminals, highly stable oscillators of this type which can be pulled in over a relatively large range, such as the range $\pm 5.10^{-4}$ of the oscillation frequency, are required. In this case, insofar as possible, there must be a linear relationship between the control voltage and the change in frequency, so that when the oscillators are used in phase control circuits, non-linear characteristics, such as changes in quality, do not occur. Due to the use of oscillators in remotely fed regenerators the current carried should be as small as possible, and in view of the wiring technology that is customarily used in frequency rangs of this kind, an ECL-compatible outlet is required. It is difficult to fulfill the above requirements with state-of-the-art quartz oscillators, because overtone quartzes are difficult to pull in in the frequency range above 100 MHz, and as a result only fundamental quartz oscillators with connected multiplier stages can be used in this range. However, as a result of the multiplier stages, the expense increases sharply in connection with the further conversion of the output signal from the oscillator and the selection of the desired harmonic. The use of LC oscillators in this frequency range and in connection with the requirements mentioned above also turns out to be very expensive, because due to the instability of these oscillators under the influence of aging and temperature fluctuations, additional stabilizing measures are necessary.

SUMMARY OF THE INVENTION

The object of the invention is to provide a voltage-controlled oscillator similiar to the type mentioned above which can fulfill all the functions of the above-mentioned oscillator but can be produced at a substantially lower cost.

According to the invention, this object is accomplished by having the feedback network include connected in series a surface wave transmission line with a pass band corresponding to the desired oscillator frequency and a 3dB-90° coupler with an added control element, and two variable capacitance diodes connected through coupling capacitors to the two terminals of the 3dB-90° coupler that are not being used as input or output terminals.

The invention offers an advantageous means of generating a rectangular output signal without additional conversion stages and selection devices. Another advantage is that the degree of feedback in the oscillator is independent of the oscillating frequency, so that during pull-in (when the oscillating frequency is changed) there is no change in the quality of the circuit.

In preferred embodiments the invention features a voltage-controlled oscillator in which the outlet of the amplifier is connected to an input terminal of the 3dB-90° coupler. An output terminal of the coupler is connected with an inlet of the surface-wave transmission line. Lastly an outlet of the surface-wave transmission line is connected with an amplifier inlet. The anode terminals of the capacitance diodes in the 3dB coupler element are respectively connected separately to a coupling capacitor with the free terminals of the 3dB coupler and through a decoupling resistance with the source for a control voltage. The cathode terminals of the capacitance diodes are connected to the reference potentials, the capacitance having a hyperabrupt characteristic. The surface-wave transmission line has two inlets of which one is connected with an output terminal of the 3dB-90° coupler and the other with a reference potential. Both input terminals are connected in a parallel circuit which includes an ohmic resistance, with a value roughly corresponding to the characteristic impedance, and a first balancing inductance. The surface-wave transmission line has two output terminals, which are connected to another balancing inductance. The amplifier includes two emitter-coupled differential amplifiers connected in series, which are operated in push-pull with the inlets of the first emitter-coupled differential amplifier being respectively connected separately to outlets of the surface-wave transmission line. The inlets of the second emitter-coupled differential amplifier are respectively connected with the outputs of the first emitter-coupled differential amplifier. An emitter follower is connected to one of the outlets of the second differential amplifer, and an emitter terminal of the emitter follower constitutes the output terminals of the voltage-controlled oscillator.

Other features and advantages of the invention will be apparent from the following detailed description and from the claims.

For a full understanding of the present invention, reference should now be made to the following detailed description of the invention and to the accompanying drawings.

DETAILED DESCRIPTION

Figure 1:
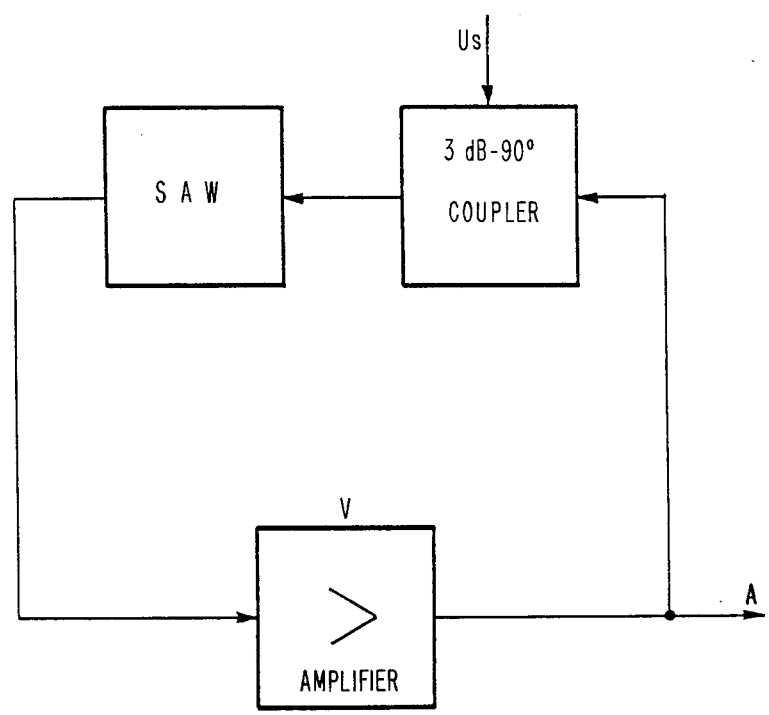
FIG. 1 shows diagrammatically the basic circuit for a voltage-controlled oscillator according to the invention.

Referring to FIG. 1, the voltage-controlled oscillator according to the invention is represented with an amplifier V, which has an outlet A for the signal that is generated: in the feedback circuit of the amplifier are included a surface-wave transmission line SAW and a 3dB-90° coupler with an added control circuit. The sequence of the surface-wave transmission line and the 3dB coupler is arbitrary; the 3dB coupler can also be designated as a 3dB hybrid circuit, a 90° coupler, a 90° hybrid circuit, a 3dB-90° coupler or a 4-port hybrid transformer. In the embodiment shown, the oscillator is designed to produce a vibration with a frequency of about 167 MHz; the surface-wave transmission line and the 3dB coupler are also designed for this frequency range. To provide voltage control, the 3dB coupler contains capacitance diodes connected to a terminal Us which is for a control voltage.

Figure 2:
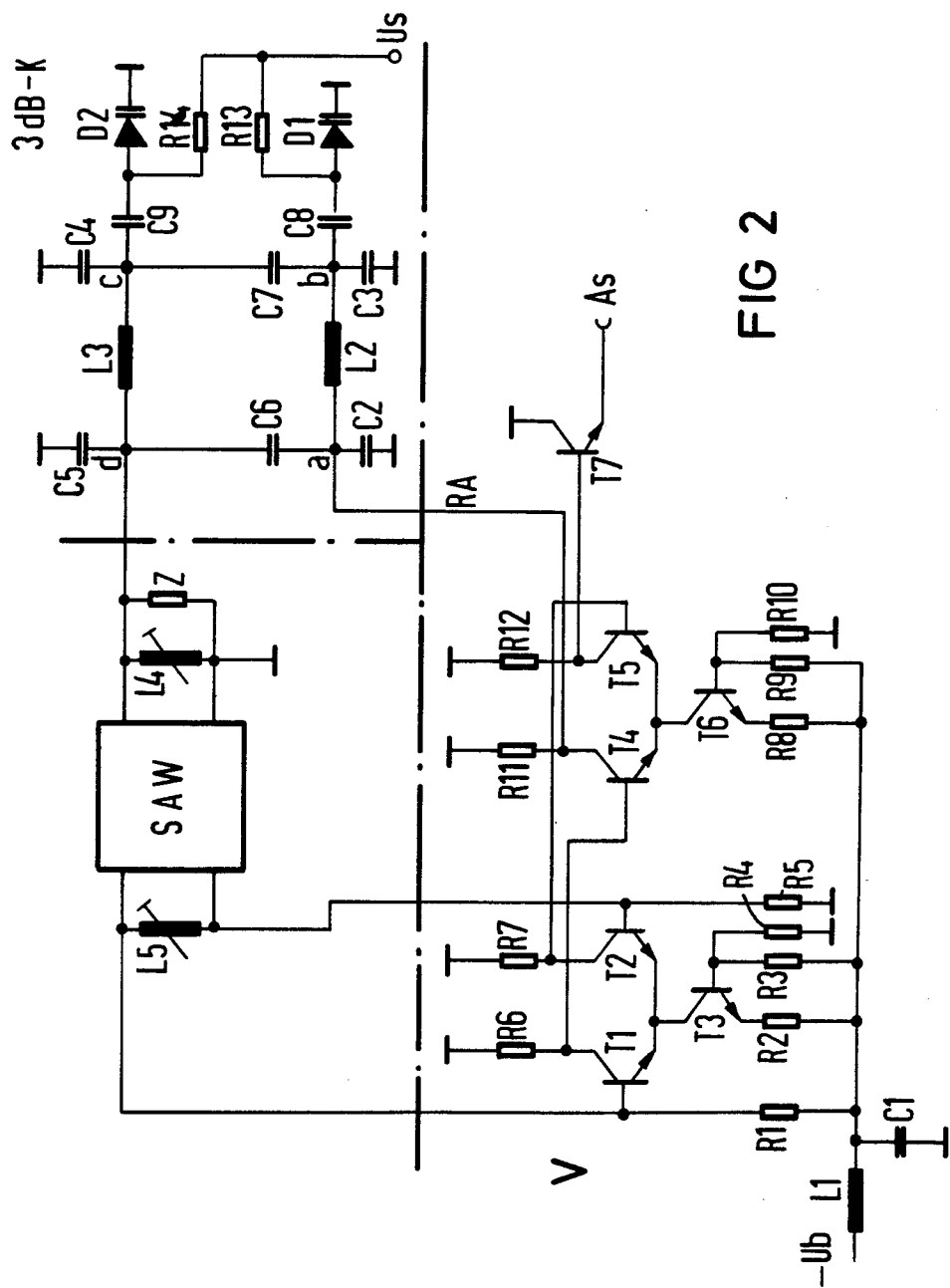
FIG. 2 shows a detailed circuit diagram of the oscillator according to FIG. 1.

Referring to FIG. 2, the voltage-controlled oscillator shown in FIG. 1 is presented in greater detail. Two emitter-coupled differential amplifiers connected in series are provided for amplifier V. These amplifiers operate in push-pull and advantageously generate the desired rectangular output signal in the switching operation on the basis of an amplitude limitation built into the amplifier. The emitter-coupled differential amplifier on the input side contains a first and a second transistor T1, T2, whose emitter terminals are connected with one another and with the collector terminal of a third transistor T3. The base terminals of the first and second transistors are connected with output terminals of the surface-wave transmission line SAW. The base terminal of the first transistor is also connected through a first resistance R1 and through a filter section consisting of a first inductance L1 and a first capacitance C1 with an operating-voltage source —Ub. The base terminal of second transistor T2 is connected through a fifth resistance R5 with a reference potential. As a result of the resistance connection to the surface-wave transmission line SAW, there is a direct-current connection of the base terminals of the first and second transistors T1, T2, and consequently a base voltage divider consisting of the first and fifth resistances R1, R5. Third transistor T3 is connected to the filter section for the operating voltage with its emitter terminal through a second resistance R2 and with its base terminal through a third resistance R3. Another base voltage divider is formed by the third resistance R3 and a fourth resistance R4, which is connected with the base terminal of the third transistor T3 on the one hand and with the reference potential on the other. The collector terminal of first transistor T1 is connected through a sixth resistance R6 with the reference voltage, and, in addition, with the base terminal of a fourth transistor T4. The collector terminal of the second transistor T2 is connected analogously through a seventh resistance R7 with the reference potential, and, in addition, directly with the base terminal of a fifth transistor T5.

The emitter terminals of the fourth and fifth transistors T4, T5 are connected with one another to form a second emitter-coupled differential amplifier. They are also connected with the collector terminal of a sixth collector T6 as an emitter-current source, whose emitter terminal is connected through an eighth resistance R8 and whose base terminal is connected through a ninth resistance R9, to the filter section for the operating voltage —Ub. The base terminal of the sixth transistor T6 is also connected through a tenth resistance R10 to the reference potential. The collector of the fourth transistor T4 which is connected with the reference potential through an eleventh resistance R11, also constitutes one outlet RA of the amplifier. The collector terminal of the fifth transistor T5 is connected to the reference voltage through a twelfth resistance R12, and, in addition, to the base terminal of a seventh transistor T7 whose collector is connected to the reference potential and whose emitter constitutes another outlet of the amplifier. This emitter also simultaneously constitutes the outlet of the voltage-controlled oscillator.

Connected with the outlet RA of the amplifier is the input terminal a of the 3dB coupler, which is connected through a second capacitor C2 with the reference potential and through a second inductance L2 with second terminal b of the 3dB coupler. The second terminal b is connected through a third capacitor C3 to the reference voltage. The input terminal a of the 3dB coupler is connected through a sixth capacitor C6 with the output terminal d; the second terminal b is connected through a seventh capacitor C7 with the third terminal c of the 3dB coupler, which is in turn connected through a fourth capacitor with the reference potential and through a third inductance L3 with the fourth terminal, which is the output terminal d. Output terminal d is connected through a fifth capacitor C5 with the reference voltage, and, in addition, with an inlet of the surface-wave transmission line SAW. Second terminal b of the 3dB coupler is connected through a first coupling capacitor C8 with the anode terminal of a first capacitance diode D1 which has a hyperabrupt characteristic, and through a thirteenth resistance R13 with a source Us for a control voltage. The third terminal c of the 3dB coupler is connected in an analogous manner through a second coupling capacitor C9 with the anode terminal of a second capacitance diode D2 which has a hyperabrupt characteristic, and through a fourteenth resistance R14 with the source Us for the control voltage. The cathode terminals of the capacitance diodes are connected with the reference potential.

The capacitance values of the second to fifth capacitors, C2, C3, C4, C5 are equal to one another, as are the capacitance values of the sixth and seventh capacitors, and the inductance values of the second and third inductances L2, L3. Thus, what is initially involved is a completely symmetrical 3dB coupler to which an added control element is connected through coupling capacitors C8, C9. When the input and output ends and the second and third terminals b, c of the 3dB coupler are match-terminated, a phase shift of 90 degrees occurs between the input terminal a and the output terminal b with a damping of 3dB; a phase shift of 0 degrees occurs between the input terminal a and the output terminal c with a damping of 3dB, and between input terminal a and output terminal d a substantial damping (20 dB decoupling damping) takes place. Next, through the coupling capacitors C8 ad C9, the second and third terminals of the 3dB coupler are connected with an additional network whose impedance can be regulated by a control voltage applied from outside, so that there is no matched termination at the second and third connection points of the 3dB coupler and consequently, through a changed reflection of the input signal, a signal is generated whose amplitude is independent of the control voltage, but whose phase changes with the control voltage. The insertion damping between inlet a and outlet b is then determined by the losses of the reactances, and, in the circuit shown here, amounts to about 1 dB.

The output terminal d of the 3dB coupler is connected to one input terminal of a surface-wave transmission line SAW which is intended for an oscillator frequency of 167 MHz. The other input terminal is connected to the reference potential; the first and second input terminals being connected through a resistance Z, with a value corresponding to the characteristics of the 3dB coupler or impedance of about 75 ohms, and through a first balancing inductance L4. Likewise, the two output terminals of the surface-wave transmission line are connected with one another through a second balancing inductance L5. The need for these balancing inductances arises from the strongly capacitive input and output impedances of the surface-wave transmission line. The output terminals of the surface-wave transmission line, at which the output signal is in push-pull, are connected with the base terminals of the first and second transistors T1, T2 of the amplifier V. Through the construction selected, both the amplifier and the 3dB coupler are match-terminated. Due to the construction selected, it is easy to manufacture the amplifier in an integrated circuit form. To that end, transistor T7 is connected as an emitter follower, and an ECL-compatible output signal is generated. On the other hand, the output terminal As can also be connected directly to the collector terminal of the fifth transistor T5 without the use of an emitter follower. The construction of the 3dB coupler is accomplished with the use of discrete elements. Construction based on stripline technology is easily performed, particularly for use at higher frequencies. The capacitance diodes used in the control part of the 3dB coupler have a so-called hyperabrupt capacitance characteristic (in other words a capacitance curve with a steep section at the beginning) and are commonly known by the designation BB609.

There has thus been shown and described a novel voltage-controlled oscillator for high frequencies which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In a voltage-controlled oscillator with an amplifier and a feedback network having variable capacitance diodes, the improvement comprising the feedback network including a surface-wave transmission line with a pass band corresponding to the desired oscillator frequency connected in a series with a 3dB-90° coupler, and two variable capacitance diodes connected through coupling capacitors with two terminals of the 3dB-90° coupler that are not used as input or output terminals.

2. The voltage-controlled oscillator according to claim 1, wherein an outlet of the amplifier is connected to an input terminal of the 3dB-90° coupler, an output terminal of the coupler is connected with an inlet of the surface-wave transmission line, and an outlet of the surface-wave transmission line is connected with an amplifier inlet.

3. The voltage-controlled oscillator according to claim 1, wherein anode terminals of the capacitance diodes in the 3dB coupler are respectively connected separately through a coupling capacitor with the two terminals of the 3dB coupler and through a decoupling resistance with a source of control voltage, and the cathode terminals of the capacitance diodes are connected to a reference potential.

4. The voltage-controlled oscillator according to claim 2, wherein anode terminals of the capacitance diodes in the 3dB coupler are respectively connected separately through a coupling capacitor with the two terminals of the 3dB coupler and through a decoupling resistance with a source of control voltage, and the cathode terminals of the capacitance diodes are connected to a reference potential.

5. The voltage-controlled oscillator according to claim 1, wherein the capacitance diodes have a hyperabrupt characteristic.

6. The voltage-controlled oscillator according to claim 3, wherein the capacitance diodes have a hyperabrupt characteristic.

7. The voltage-controlled oscillator according to claim 1, wherein the surface-wave transmission line has two input terminals of which one is connected with an output terminal of the 3dB-90° coupler and the other with a reference potential, and both input terminals are connected in a parallel circuit which includes an ohmic resistance, with a value roughly corresponding to the characteristic impedance of the 3dB-90° coupler, and a first balancing inductance, and the surface-wave transmission line has two output terminals which are connected through another balancing inductance.

8. The voltage-controlled oscillator according to claim 2, wherein the surface-wave transmission line has two input terminals of which one is connected with an output terminal of the 3dB-90° coupler and the other with a reference potential, and both input terminals are connected in a parallel circuit which includes an ohmic resistance, with a value roughly corresponding to the characteristic impedance of the 3dB-90° coupler, and a first balancing inductance, and the surface-wave transmission line has two output terminals which are connected through another balancing inductance.

9. The voltage-controlled oscillator according to claim 1, wherein the amplifier includes two emitter-coupled differential amplifiers connected in series, which are operated in push-pull with the step inlets of the first emitter-coupled differential amplifier being respectively connected separately to outlets of the surface-wave transmission line and the step inlets of the second emitter-coupled differential amplifier are respectively connected with the step outlets of the first emitter-coupled differential amplifier.

10. The voltage-controlled oscillator according to claim 2, wherein the amplifier includes two emitter-coupled differential amplifiers connected in series, which are operated in push-pull with the step inlets of the first emitter-coupled differential amplifier being respectively connected separately to outlets of the surface-wave transmission line and the step inlets of the second emitter-coupled differential amplifier are respectively connected with the step outlets of the first emitter-coupled differential amplifier.

11. The voltage-controlled oscillator according to claim 9, wherein an emitter follower is connected to one of the outlets of the second differential amplifier, and an emitter terminal of the emitter follower constitutes the output terminal of the voltage-controlled oscillator.

* * * * *